United States Patent [19]

Koerber

[11] 4,038,604
[45] July 26, 1977

[54] SIGNAL TO NOISE RATIO INDICATING CIRCUIT

[75] Inventor: Clement J. Koerber, Cincinnati, Ohio

[73] Assignee: Cincinnati Electronics Corporation, Cincinnati, Ohio

[21] Appl. No.: 640,876

[22] Filed: Dec. 15, 1975

[51] Int. Cl.² .............................................. H04B 1/10
[52] U.S. Cl. ..................................... 325/363; 325/348; 325/478; 325/403; 325/474
[58] Field of Search ............... 325/363, 478, 348, 429, 325/473, 474, 403, 404; 179/1 P

[56] References Cited

U.S. PATENT DOCUMENTS

| | | | |
|---|---|---|---|
| 2,942,105 | 6/1960 | Hargreaves, Jr. | 325/348 |
| 3,196,354 | 6/1965 | Engelbrecht | 325/478 |
| 3,217,258 | 11/1965 | Arlin et al. | 325/363 |
| 3,238,457 | 3/1966 | Boymel et al. | 179/1 P |
| 3,626,294 | 12/1971 | Dancy | 325/478 |
| 3,699,457 | 10/1972 | Wright | 325/348 |
| 3,747,703 | 7/1973 | Knowd et al. | 179/1 P |

Primary Examiner—Benedict V. Safourek
Assistant Examiner—Tommy P. Chin
Attorney, Agent, or Firm—Lowe, King, Price & Markva

[57] ABSTRACT

A radio receiver squelch circuit responds to an IF carrier modulated by any of AM voice, AM pulse, CW, interrupted CW, or angle modulated signals. After the IF carrier is amplitude normalized it is supplied to a network for deriving a D.C. voltage having an amplitude indicative of the signal to noise level of the normalized IF. The signal to noise level indicating circuit includes a detector for deriving a waveform that is a replica of the envelope of the normalized IF. In response to the envelope amplitude being above a predetermined threshold level, indicative of the presence of a signal, a capacitor is discharged by a constant current source. In response to the envelope being below the predetermined level for an initial predetermined time, the capacitor is charged by a constant current source. In response to the envelope amplitude being below the predetermined level for in excess of the initial predetermined time, the capacitor is charged by a much smaller current. Thereby, the capacitor voltage level is indicative of the signal to noise ratio of the IF signal. The voltage across the capacitor is monitored with an amplitude comparison including amplitude hysteresis to derive a squelch control signal.

15 Claims, 9 Drawing Figures

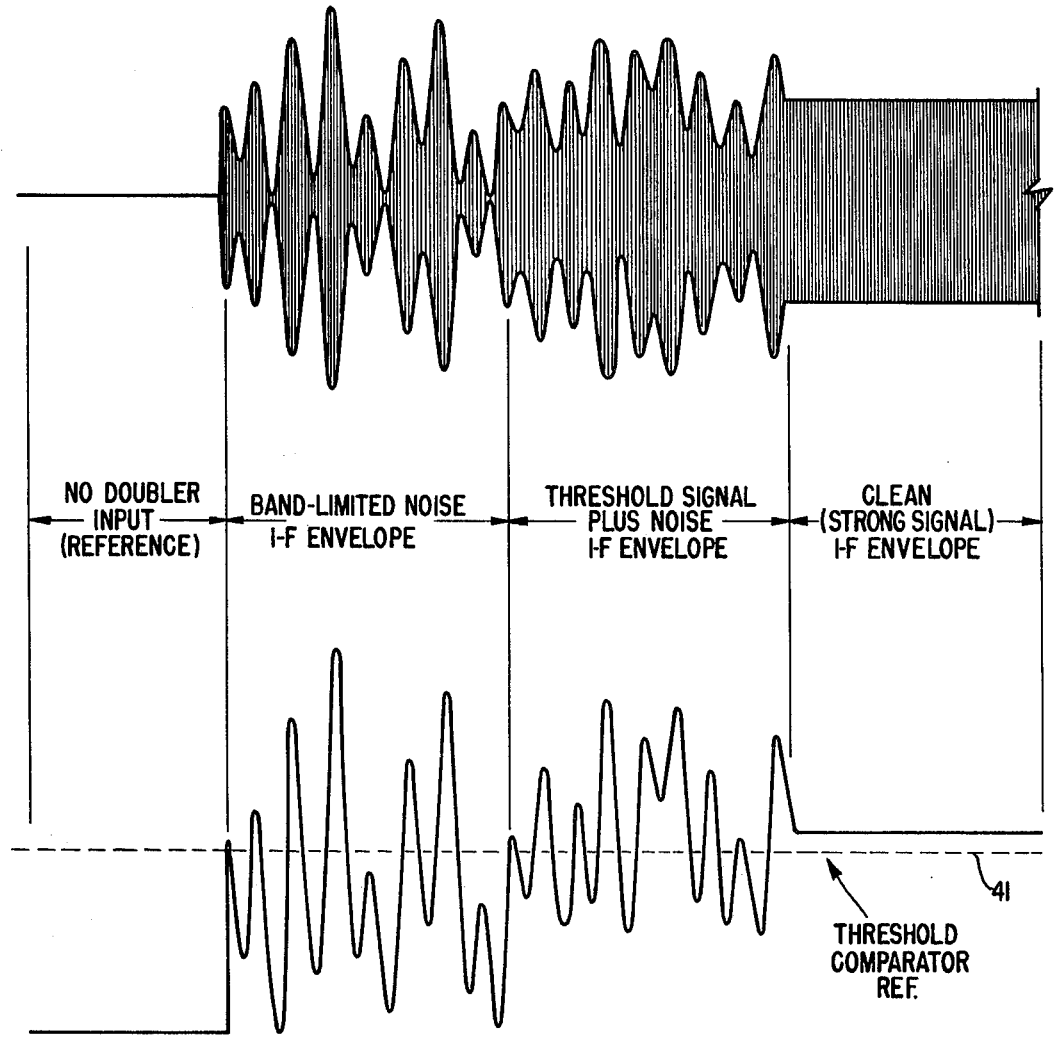

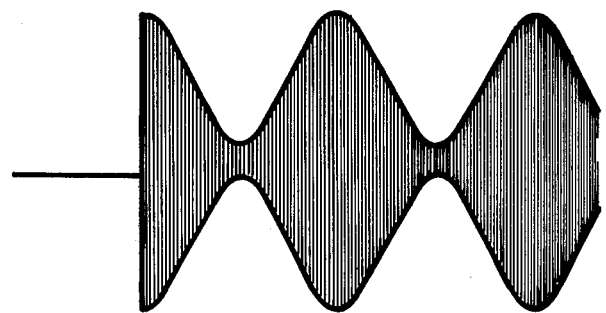
FIG. 3A
INPUT TO 28
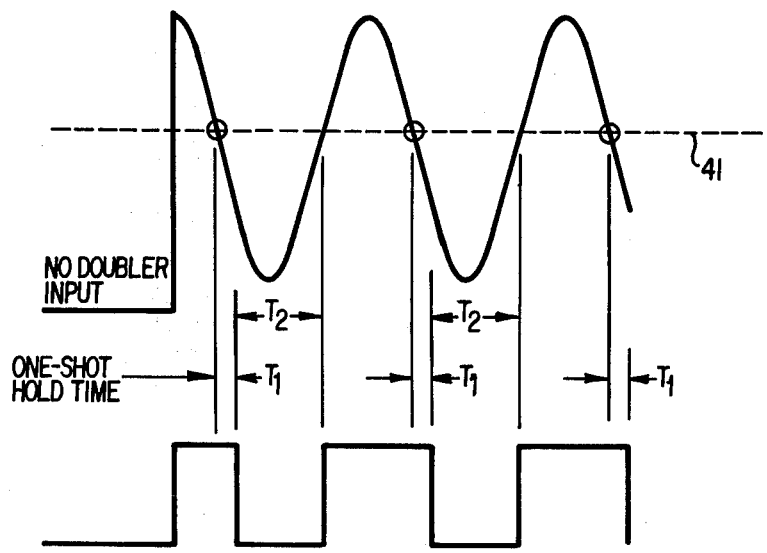
FIG. 3B
OUTPUT OF 28
FIG. 3C
OUTPUT OF 32

SIGNAL TO NOISE RATIO INDICATING CIRCUIT

FIELD OF THE INVENTION

The present invention relates generally to apparatus for amd method of monitoring signal to noise ratios and more particularly to an indicator of signal to noise ratio wherein the relative lengths of time waveform is above and below a threshold are accumulated.

BACKGROUND OF THE INVENTION

Squelch circuits for radio receivers generally include a circuit to determine the signal to noise ratio of a signal derived by the radio receiver in response to the modulated waveform picked up by the receiver. In response to the signal to noise ratio being above a predetermined value, the detected modulated signal is coupled to an output device, such as a loud speaker. If the signal to noise ratio is so low that intelligent communication cannot be derived from the modulated carrier received, the detected modulated wave is not coupled to the output device so that an operator does not listen to a garbled, noise signal which would be annoying and unintelligible.

One of the three main categories that signal to noise ratio detectors generally utilized in prior art squelch circuits generally involves detecting the modulated carrier to derive an audio signal indicative of a voice or other audio signal modulated on the carrier. The audio signal is coupled to a spectral energy distribution network wherein the energy in two or more fixed frequency bands is compared to derive the squelch control signal. While this system has been widely adapted, it has certain disadvantages since the bandwidth of the signal coupled to the audio detector must be fixed; otherwise, sampling the spectral energy distribution in two more fixed frequency bands is not meaningful. A further disadvantage of responding to the detected audio signal is that such signal to noise ratio detecting circuits must be utilized in connection with a particular type of modulation detector. For example, if a receiver is adapted to be responsive to different types of AM and angle modulation having differently bandwidths, different audio response squelch networks must be employed for the different modulation types.

A second type of squelch control circuit has relied upon an AGC control voltage as an indication of the level of the signal to actuate a squelch controlled gate. The main problem with utilizing AGC as the basis for deriving a control voltage for a squelch gate is that the AGC voltage provides no indication as to the noise level on the signal. Instead, the AGC voltage merely indicates the strength of the signal; if the signal is weak, but is not noisy, the AGC level provides no indication of this fact. In the opposite manner, if the signal is strong, but there is a significant amount of noise on it, the AGC signal does not provide any indication of this fact. Because the AGC detector cannot discriminate between signal and noise, it is necessary to set a threshold level that is compared with the AGC voltage at a relatively high point so that the squelch gate is not triggered in response to high level noise alone. Typically, a minimum signal to noise ratio of approximately 20db is necessary for this type of squelch controller.

The most precise prior art signal to noise squelch control circuit of which I am aware includes a plurality of comb filters responsive to a received RF signal. A different portion of the received RF signal spectrum is supplied through each of the comb filters to a detector. Each detector indicates the presence of a signal component within the frequency band of the filter which derives the detector. The levels derived from the different detectors are compared with each other to derive an indication of signal to noise ratio over the entire RF band. Because of the requirement to utilize multiple narrow band bandpass filters, amplitude detectors and comparator circuits, the comb filter approach suffers from high cost, as well as great bulk and weight. It has the advantage, however, of not requiring prior knowledge of the type of modulation imposed on the RF carrier received by the radio receiver.

BRIEF DESCRIPTION OF THE INVENTION

In accordance with the present invention, a signal to noise ratio detector indicates the relative lengths of time a waveform is: (a) above a threshold value, (b) below a threshold value for a length of time substantially equal to or less than the time of the longest noise undulation on the waveform, and (c) below a threshold value for a length of time greater than the length of time of the longest noise undulation on the waveform. The net lengths of time indicated by (a) and (b) are differentially accumulated with substantially equal contributions, while the length of time indicated by (c) is accumulated with a much lower contribution than the equal contributions. The much lower contribution for (c) is made in the same direction as the contribution resulting from (b).

The detector is particularly applicable to operate a squelch control circuit of a radio receiver in response to a carrier modulated with any of AM voice, AM pulse, CW, interrupted CW, and angle modulated (FM and phase modulated) signals. The received RF carrier is preferably converted into an IF carrier that is amplitude normalized. The amplitude normalized If carrier is applied to a network for deriving an output voltage indicative of the IF signal to noise ratio. The signal to noise ratio indicating circuit includes a detector for deriving a waveform that is a replica of the envelope of the IF carrier. In response to the envelope amplitude exceeding a predetermined threshold level, which is assumed to be the boundary between the envelope containing signal information and noise, a capacitor is driven at a predetermined rate in a first direction by a constant current source. In response to the envelope amplitude initially dropping below the threshold level during an initial predetermined time, the capacitor is charged at the same rate in the opposite, second direction. In response to the envelope staying below the threshold for an interval in excess of the initial predetermined time, the capacitor is charged in the second direction at a much slower, trickle rate. Thereby, the capacitor functions as an accumulator and the capacitor voltage level is indicative of the signal to noise ratio for all of the previously mentioned different types of modulation.

If, for example, the carrier was originally transmitted as a constant envelope carrier, such as is derived from an FM, PM or CW modulated carrier, and the originally transmitted carrier is received without noise, the constant current is supplied to the capacitor in the first direction for a relatively long time duration. If, however, the originally transmitted constant amplitude carrier was subjected to noise, the time that the carrier was above the threshold value relative to the time it was below the threshold value would be decreased. Thereby, the capacitor is alternately charged and discharged at the same rate and the voltage across the capacitor assumes a level indicative of a relatively large amount of noise being present. Alternate charging and discharging of the capacitor at the same rate occurs in response to noise signals because the duration of noise undulations below the threshold level is generally less than the initial predetermined time.

In contrast, the audio modulation undulations imposed on the carrier are considerably greater than the initial time. Thereby, the capacitor is charged in the first direction at the constant rate for a substantial time in response to the audio modulation being above the threshold, but is charged in the second direction at the constant rate for a considerably shorter period of time in response to the audio modulation being below the threshold value. Since the capacitor is charged at a slow rate after the initial period, the capacitor voltage after a complete cycle of the audio modulation indicates that a high signal to noise ratio signal is being received.

By supplying the capacitor with a trickle charge in response to the envelope amplitude being below the threshold level for long time intervals, the system is capable of indicating that no signal is being received, as well as indicating signal to noise ratios.

A feature of the invention is that the initial time interval is changed as a function of bandwidth of IF circuitry driving the signal to noise ratio determining circuitry. Thereby, for wide bandwidth IF drivers, wherein the noise is likely to contain mostly high frequency components, the intitial predetermined interval is made relatively short; for narrower bandwidth IF signals, wherein the noise has a lower frequency spread, the predeteremined interval is set to a longer duration. Also, the boundary threshold between signal and noise is set as a function of the bandwidth of the IF signal driving the signal to noise ratio indicating circuit.

The voltage developed across the capacitor, which is indicative of signal to noise ratio of the IF modulated carrier, is applied to an amplitude detector that derives an output signal for activating an audio gate for coupling a detected waveform containing the modulation information to an output device, such as an audio amplifier. A feature of the amplitude detector is that is includes amplitude hysteresis, whereby small amplitude swings of the voltage across the capacitor do not affect the squelch circuit output. The hysteresis circuit drives a hold delay circuit so that signals which are subject to rapid short-term fading do not cause chattering of the squelch circuit output and resultant chattering in the audio output signal.

It is, accordingly, an object of the present invention to provide a new and improved signal to noise ratio indicating circuit.

Another object of the invention is to provide a new and improved squelch circuit.

Yet another object of the invention is to provide a new and improved relatively inexpensive and uncomplicated signal to noise ratio detector or squelch drive circuit, which is also relatively lightweight and not bulky.

A further object of the invention is to provide a signal to noise ratio indicating circuit that is adapted to be utilized with a carrier that is modulated by any of AM voice, AM pulse, CW, interrupted CW or angle modulated signals.

A further object of the invention is to provide a new and improved signal to noise ratio indicating circuit or squelch control circuit which responds to a carrier modulated wave prior to detection.

Still another object of the invention is to provide a new and improved signal to noise ratio indicating circuit or squelch control circuit which provides an output indicative of noise in response to a noise signal or no signal being received by a receiver with which the signal to noise ratio indicator or squelch control circuit is responsive.

An additional object of the invention is to provide a new and improved signal to noise ratio discriminating circuit or squelch activating circuit which is responsive to a true signal to noise ratio indication, rather than an indication of the amplitude of a received signal.

An additional object of the invention is to provide a signal to noise ratio indicator or squelch driver circuit which measures the relative time intervals a signal envelope amplitude is above and below a threshold level, without requiring filters.

The above and still further objects, features and advantages of the present invention will become apparent upon consideration of the following detailed description of one specific embodiment thereof, especially when taken in conjunction with the accompanying drawing.

BRIEF DESCRIPTION OF THE DRAWING

FIGS. 2A and 2B are illustrations of waveforms useful in understanding the operation of the system of FIG. 1 when it is responsive to noise alone, to a noisy signal, and to a signal having a constant amplitude envelope;

FIGS. 3A-3C are waveforms useful in understanding the operation of the device in response to a linear amplitude modulated carrier;

DETAILED DESCRIPTION OF THE DRAWING

Figure 1:
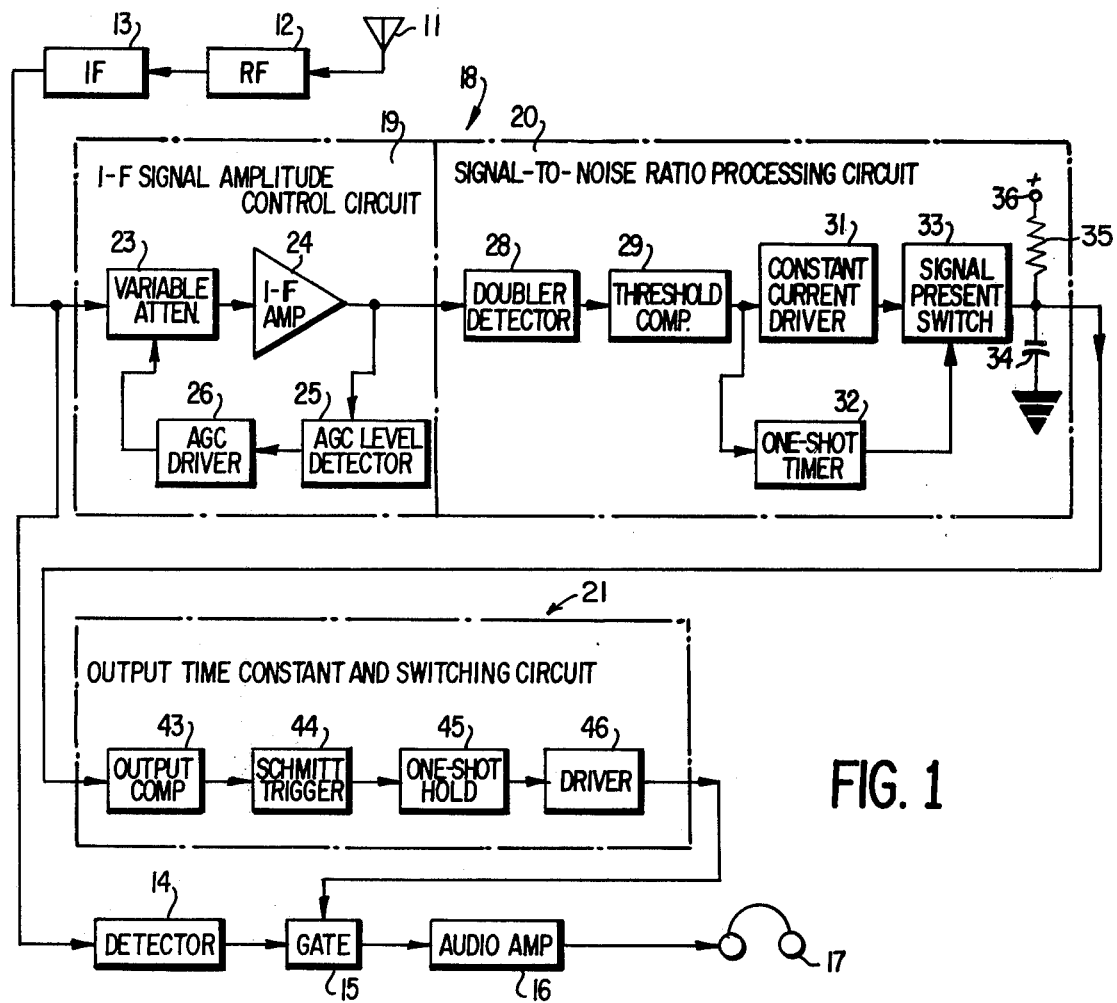
FIG. 1 is a block diagram of a preferred embodiment of the present invention.

Reference is now made to FIG. 1 of the drawing wherein there is illustrated, in block diagram form, a radio receiver including a signal to noise ratio and squelch circuit control in accordance with the present invention. The radio receiver includes the usual components of an antenna 11 which drives a tunable RF amplifier 12, which in turn drives an intermediate frequency (IF) amplifier 13 that derives a constant frequency carrier output that is modulated with the same information as the RF wave received by antenna 11. The IF carrier derived from amplifier 13 can be modulated by any of AM voice, AM pulse, continuous wave (CW), interrupted CW or angle modulated (phase modulation or frequency modulated) signals. The bandwidth of IF amplifier 13 is adjustable, depending upon the type of modulated wave received; the present invention is capable of operating in connection with IF bandwidths that vary from 10 KHz up to 2.2 MHz in a preferred embodiment.

The IF carrier derived from amplifier 13 is applied to a suitable modulation detector 14. Depending upon the type of modulation, detector 14 can be the type adapted to derive audio signal information in response to the RF carrier being modulated by an AM voice signal, an AM pulse signal, a CW wave, an interrupted CW wave or either type of angle modulated signal. The audio information output signal of detector 14 is selectively applied through squelch gate 15 to audio amplifier 16 which drives an output device, such as headphones 17.

IF amplifier 13 derives a modulated carrier having the same undulations as the carrier received by antenna 11. Hence, any variations in the envelope in the carrier received at antenna 11 are coupled to the output of IF amplifier 13, provided these variations are within the bandpass of the RF and IF amplifiers.

The output signal of IF amplifier 13 is applied to network 18 which forms the basis of the present invention. Network 18 includes IF signal amplitude control circuit 19 which is directly responsive to the output of amplifier 13. Circuit 19 derives an amplitude normalized output signal containing all of the undulations on the output of IF amplifier 13. The output signal of circuit 19 is applied to circuit 20 which derives a D.C. voltage indicative of the signal to noise ratio of its input signal. In response to the signal to noise ratio of the signal applied to circuit 20 being relatively high, the output voltage of the circuit is low; in contrast, if no signal or a signal having a low signal to noise ratio is applied to circuit 20, the circuit derives a relatively high output voltage. Circuit 20 drives voltage magnitude comparison circuit 21 which derives a binary 1 level in response to the voltage derived from circuit 20 indicating that a high signal to noise ratio signal is coupled to circuit 20; in response to a low signal to noise ratio signal or no signal being applied to circuit 20, circuit 21 derives a binary zero output signal. The binary output signal of circuit 21 is applied to gate 15 so that the gate is activated to pass the output of detector 14 to audio amplifier 16 in response to a binary 1 being derived from circuit 21. In response to a binary zero being derived from circuit 21, gate 15 is activated to decouple audio amplifier 16 from the audio output signal of detector 14.

IF signal amplitude control circuit 19 responds to the output signal of IF amplifier 13 to derive an output signal having a substantially constant level. To this end, the output signal of amplifier 13 is applied to a variable attenuator 23 that drives IF amplifier 24. IF amplifier 24 has a relatively broad band design so that it can respond to signals from IF amplifier networks having different center frequencies. IF amplifier 24 derives a carrier modulated output signal that is applied to AGC level detector 25, where the level of the IF output is compared with a reference level using quasi-peak level comparison. Detector 25 derives an output signal indicative of the difference between the output level of amplifier 24 and the reference level applied to detector 25; the D.C. signal derived from detector 25 is applied to AGC driver 26 which controls the attenuation of variable attenuator 23. If the receiver is responsive to an FM or PM carrier, control circuit 19 prevents intermodulation distortion, as well as providing amplitude normalization.

The amplitude normalized, modulated carrier envelope derived from amplifier 24 is amplitude detected in doubler detector 28 of signal to noise ratio determining circuit 20. Detector 28 has a relatively short time constant so that it can follow relatively high frequency undulations on the envelope of the signal applied to it. The input and output waveforms of detector 28 for different types of modulation are indicated in FIGS. 2 and 3. In particular, in FIGS. 2A and 2B there are respectively illustrated the input and output waveforms of detector 28 for no doubler input signal; band-limited noise; a threshold signal plus noise IF envelope; and a constant amplitude IF envelope, as is derived from IF amplifier 13 in response to an FM, PM or CW signal having no noise component. In FIGS. 3A and 3B, are illustrated the input and output waveforms of detector 28 for no doubler input signal and a linear amplitude modulated carrier, having no noise.

As seen in the lefthand portions of FIGS. 2A and 2B, if no signal is applied to detector 28, the detector derives a zero output voltage, shown for reference. If no input is present at receiver antenna 11 the output from the i-f amplifier 13 consists of band limited random noise. This noise is amplitude normalized by control circuit 19 using quasi-peak normalization, and is illustrated by the left central portion of FIG. 2A. Detector 28 derives an output signal that is a replica of the envelope, showing the high peak-to-rms variations; the output signal has a D.C. value displaced from the zero level which is commensurate with the average value of the noise derived from the detector. For a weak signal applied to control circuit 19, quasi-peak amplitude normalization reduces carrier and noise proportionately, as illustrated by the right central portion of FIG. 2A. Again, detector 28 derives an output that is a replica of the envelope variations, and which has a greater D.C. displacement from zero due to the presence of the signal. In response to a constant amplitude, noiseless signal envelope being applied to detector 28, the detector derives a constant, positive D.C. voltage, as indicated by the righthand segments of FIGS. 2A and 2B.

Similarly, as illustrated in FIGS. 3A and 3B, the detector derives an output signal that is a replica of the envelope of a linear amplitude modulated carrier applied to the detector; the replica has a D.C. level displaced from a zero voltage level commensurate with the average value of the signal being applied to the detector. (The no input signal condition to detector 28 is again shown to aid in describing the functioning of the detector. It is to be understood that in practice a receiver with no input produces a band limited noise signal at the output of IF amplifier 24 and this noise signal would be reflected in undulations illustrated by the left central portion of FIG. 2A, as already described.)

The output signal of detector 28 is applied to threshold comparator 29, which is set at a level determined by the bandwidth of the output signal of IF amplifier 13. The threshold level of comparator 29 is set so that amplitude levels derived from detector 28 above the threshold level are considered as signals, while amplitude levels below the threshold level are considered as noise "holes". However, as illustrated in FIGS. 2 and 3, noise may subsist above the threshold level and meaningful signals, particularly signals derived from linear amplitude modulated carriers, may exist below the threshold level of comparator 29. The threshold level is set so that the normalized output of amplifier 24, when modulated by a noise-free constant amplitude carrier, always results in an input to comparator 29 from detector 28 that is above the threshold level. In response to the input to comparator 29 from detector 28 being above the threshold level, the comparator derives a differential output in one sense; in contrast, in response to the signal input to comparator 29 being lower than the threshold level, the comparator derives a differential output in the opposite sense.

The differential output signal of threshold comparator 29 is applied in parallel to constant current driver 31 and one-shot timer 32. In response to the output of comparator 29 having an above-threshold sense, one-shot 32 derives a binary 1 output level. One-shot timer 32 continues to derive a binary 1 level for an initial time period after comparator 29 has switched from the above-threshold to the below-threshold state. After the initial time has elapsed, one-shot timer 32 derives a binary zero signal if comparator 29 is still deriving a below-threshold output at the completion of the initial period, provided no above-threshold state was derived from comparator 29 during the initial period. The length of the initial period is such that noise which is below the threshold of comparator 29 and derived by detector 28 does not generally subsist long enough to enable the output of timer 32 to switch from a binary 1 to a binary zero state. Thereby, in response to noise being coupled to threshold comparator 29, timer 32 derives a binary 1 output level because the one-half cycle duration of a noise undulation is generally less than the initial period of one-shot timer 32.

The binary output signal of one-shot timer 32 is applied as a control signal to switch 33 that is connected in series between constant current driver 31 and charging capacitor 34. Constant current driver 31 responds to the differential binary outputs of threshold comparator 29 so that it derives a predetermined constant positive current in response to a below-threshold output being derived from the threshold comparator, while a constant negative current of the same amplitude as the predetermined constant positive current is derived from the driver in response to an above-threshold output being derived from the comparator. Thus, in response to the output signal of detector 28 being above the reference level, a negative constant current is derived from driver 31, while a constant positive current is derived from the driver in response to the input to comparator 29 being below the threshold level.

The negative current derived from driver 31 is always applied through switch 33 to capacitor 34, causing the capacitor to be discharged at a linear rate. This result is achieved because switch 33 is always closed-circuited in response to the binary 1 output of one-shot timer 32 which occurs while the negative current is being derived from driver 31. A positive current is supplied by driver 31 to capacitor 34 through switch 33 during the initial interval of timer 32, i.e., during the initial period while a below-threshold output is derived from comparator 29, since switch 33 is closed-circuited during the initial interval in response to the binary 1 output of one-shot timer 32.

After the initial interval has elapsed, and a binary zero is derived from timer 32, switch 33 is open-circuited and capacitor 34 is no longer driven by the constant positive current derived from driver 31. Instead, capacitor 34 is responsive to a much lower current, as derived from a constant trickle current source comprising resistor 35 and a positive D.C. power supply connected to terminal 36. Typically, the trickle current is three orders of magnitude less than the constant currents supplied to capacitor 34 through switch 33. The trickle current supplied to capacitor 34 through resistor 35 enables the capacitor to be charged if neither signal nor noise is coupled to the input of detector 28 for a prolong time interval, in which event the input to comparator 29 is below the threshold value and switch 33 remains open for a prolong time interval. Thereby, capacitor 34 is eventually charged to an appreciable above ground voltage in response to switch 33 being constantly opened, as occurs in response to neither signal nor noise being coupled by detector 28 to comparator 29. The above ground condition of capacitor 34 is sensed by circuit 21 to control gate 15.

The operation of signal to noise ratio processing circuit 20 in response to noise can be seen by considering the left central portions of FIGS. 2A and 2B. It is seen from the left central portion of FIG. 2B that the noise undulations are above threshold level 41 for significantly less time than they are below threshold level 41. The length of time that the noise is below the threshold level 41 is normally less than the initial period set into timer 32. Thereby, switch 33 remains closed-circuited throughout the interval while the noise in the left central portion of FIG. 2B is being processed. In response to the noise having an amplitude less than threshold 41, a positive current is supplied by driver 31 to capacitor 34; driver 31 supplies an equal negative current to the capacitor during each of the intervals while the noise is above the threshold 41. Since the noise is above the threshold for less time than it is below the threshold, a positive voltage having a value greater than a threshold value subsists across capacitor 34 at the end of the noise interval. The positive voltage is recognized by circuit 21 as being commensurate with a low signal to noise ratio, whereby circuit 21 derives a binary zero output to activate gate 15 in such a manner as to prevent coupling between detector 14 and amplifier 16.

In response to a threshold signal-to-noise ratio, as indicated by the right-central portion of FIG. 2B, the noise undulations are displaced by the positive, direct voltage component of the signal. Since detector 28 output is above threshold 41 for more time than it is below threshold, capacitor 34 is driven by a negative current, corresponding to the above-threshold output of comparator 29 for a greater period of time than it is charged by a positive, equal current. Thereby, the net effect is that capacitor 34 is discharged to a value which is recognized by circuit 21 as being commensurate with an above-threshold signal-to-noise ratio, whereby circuit 21 derives a binary 1 output to activate gate 15 to cause coupling of couple detector 14 output to audio amplifier 16.

In response to a constant amplitude, noiseless signal being derived from amplitude-normalizing circuit 19, as indicated by the right portion of FIG. 2A, a constant amplitude voltage above threshold level 41 is derived by detector 28, as indicated by the right portion of FIG. 2B. In response to the constant amplitude output of detector 28, comparator 29 activates one-shot timer 32 into a binary 1 state, to close switch 33 so that a negative constant current is supplied to capacitor 34 by driver 31. The constant negative current causes capacitor 34 to discharge to a sufficiently low voltage to cause a binary 1 to be derived from circuit 21, to activate gate 15 whereby detector 14 and amplifier 16 are coupled together.

To provide an understanding as to the manner in which the signal to noise ratio processing circuit 20 responds to an AM wave having a relatively high index of modulation, consideration is given to FIGS. 3A-3C. The linear amplitude modulated carrier, of normalized amplitude, as illustrated in FIG. 3A, is applied to detector 28 which derives the waveform illustrated in FIG.

3B. It is noted that the undulations in the waveform of FIG. 3B are centered about a level which is below the threshold level 41, and that the period of each positive and negative undulation about the threshold is considerably in excess of the noise undulations in the waveform of FIG. 2B, and of the initial period $T_1$, associated with one-shot timer 32. In response to the waveform of FIG. 3B being above threshold level 41, switch 33 is closed and driver 31 supplies a negative current to capacitor 34, causing the capacitor to be discharged at a linear rate. For the initial period, $T_1$, of the undulations of the waveform of FIG. 3B being less than threshold level 41, switch 33 remains closed whereby a positive current is supplied by driver 31 to capacitor 34, causing the capacitor to be charged at the same rate at which it was discharged by the negative constant current. Thus, for the waveforms illustrated in FIGS. 3A-3B, switch 33 is closed all of the time while the waveform of FIG. 3B is above reference for threshold level 41, in addition to the initial interval $T_1$, as illustrated by the rectangular waveforms of FIG. 3C.

Upon the completion of the initial interval, $T_1$, and during the remainder of the time, $T_2$, while the output of detector 28 is below the threshold level 41, switch 33 is opened and capacitor 34 is charged only by the trickle current supplied to it through resistor 35. Thereby, a net negative current is applied to capacitor 34 over several cycles of the output of detector 28, causing the capacitor voltage to drop and a binary 1 to be derived from circuit 21 to activate gate 15 so detector 14 and amplifier 16 are coupled together throughout the interval while the AM signal is derived from amplifier 13. This is true even though the output of detector 28 drops below the threshold level 41 for a considerable portion of the time. However, the time intervals during which the AM output of detector 28 is above threshold level 41 are great enough to cause the voltage of capacitor 34 to be at a low enough level to cause a binary 1 to be derived from circuit 21.

The time interval $T_1$ of one-shot timer 32 is set short enough so as not to significantly impact the charge state on capacitor 34, but long enough that switch 33 will not open instantly and blank out a noise hole in the signal envelope. Since the time duration of noise holes and spikes varies inversely with bandwidth, it is necessary to switch the hold time, $T_1$, of one-shot 32 for changes in IF bandwidth if optimum performance is to be achieved. Since linear amplitude modulation is limited to voice modulation, the hold time $T_1$ is optimized for a 4 KHz maximum modulating frequency. Little variation is measured in signal to noise ratio for single tone modulation from 300 Hertz to 4 KHz. Since voice has a peak concentration of energy in the 600 Hertz to 1 KHz range, single tone modulation at a 4 KHz modulating frequency is a more stringent performance test than actual voice.

For pulse AM modulation, the operation of threshold comparator 29, constant current driver 31, one-shot timer 32, signal present switch 33 and capacitor 34 is essentially as described above in connection with FIGS. 3B and 3C for the linear amplitude modulation situation. Signal present switch 33 remains open during the period while no pulse is modulating the carrier derived from amplifier 13 so the charge applied to capacitor 34 is not significantly changed during the pulse absent period.

As previously noted, the voltage developed across capacitor 34 decreases as the signal to noise ratio of the output of IF amplifier 13 increases. Circuit 21 senses the level of the voltage across capacitor 34 to derive the binary signals applied to gate 15. Circuit 21 includes amplitude hysteresis so that the signal to noise ratio indication derived from capacitor 34 must vary by a predetermined amount about a preset level before there is a change in the condition of gate 15. In addition, the amplitude must vary about the preset level for a period in excess of rapid short-term fading of the carrier signals, so that gate 5 is not electrically opened and closed in a chattering mode.

To these ends, circuit 21 includes a comparator 43 which is responsive to a preset D.C. reference level and the voltage across capacitor 34 to derive an output voltage indicative of the difference between the preset level and the capacitor voltage. Comparator 43 and Schmitt trigger circuit 44 are formed as a single circuit. Together, comparator 43 and trigger 44 include provision for the amplitude hysteresis. That is, they are activated to derive a binary zero output in response to the voltage applied to comparator 43 being below a threshold level $+E$, down to zero volts. Trigger 44 continues to derive the binary zero output even through the input to comparator 43 increases to a level of $\Delta E$ above the $+E$ threshold. Once Schmitt trigger 44 is activated to derive a binary one output in response to the comparator input being greater than $+E + \Delta E$, the trigger continues to derive a binary one until the input to comparator 43 again drops below the threshold level of $+E$. Thus, the output of Schmitt trigger is modified only in response to amplitude swings of the voltage across capacitor 34 greater than $\Delta E$ above $+E$. The output signal of Schmitt trigger 44 is applied to a one-shot hold network 45 similar to one-shot timer 32. A binary zero output of Schmitt trigger 44, corresponding to a signal-present condition, causes a binary zero to be derived instantly from one-shot hold network 45. The binary zero output is derived from one-shot hold network 45 for an initial period subsequent to the termination of a binary zero output of Schmitt trigger 44. The initial period of network 45 is substantially longer than that of one-shot timer 32 and does not vary with bandwidth. Upon the completion of this initial period of network 45, while a binary 1 is derived from Schmitt trigger 44, one-shot hold network 45 derives a binary 1 output. Thereby, any rigid short-term fading in the output signal of IF amplifier 13, which would otherwise cause a binary 1 to be derived from one-shot hold network 45, is not reflected in the output of the one-shot hold network, so long as the signal does not fade for a time duration in excess of the initial period of network 45. The binary output of one-shot hold network 45 is applied to gate 15 through driver circuit 46 so that gate 15 couples detector 14 to amplifier 16 in response to a high signal to noise ratio being detected and the gate decouples the detector from the amplifier in response to no signal or a low signal to noise ratio.

Figure 4:
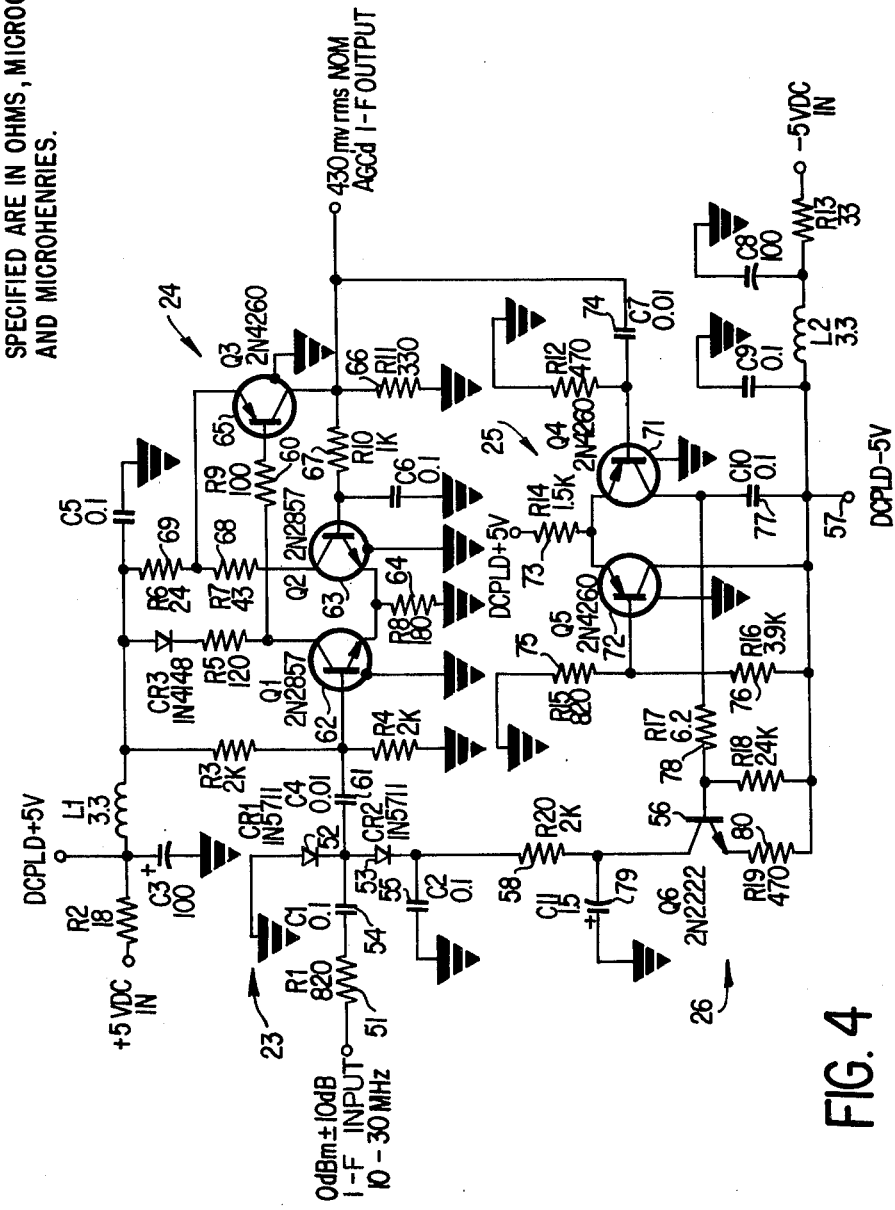
FIG. 4 is a circuit diagram of a preferred embodiment for the IF signal amplitude control circuitry included in the block diagram of FIG. 1.

Reference is now made to FIG. 4 of the drawing wherein there is illustrated a detailed circuit diagram of the components included in IF signal amplitude control circuit 19. Variable attenuator 23, FIG. 1, includes a voltage divider, driven by the output of IF amplifier 13, and including series resistor 51 and diodes 52 and 53 which are connected in parallel A.C. Capacitor 54 provides coupling and D.C. isolation between the amplifier 13 and diodes 52 and 53, and capacitor 55 provides an A.C. ground return for diode 53. Diodes 52 and 53 are connected in a D.C. series circuit with each other, with the anode of diode 52 being grounded and the cathode of diode 53 being connected to a minus D.C. potential developed across capacitor 55. The D.C. series and A.C. parallel connections of diodes 52 and 53 eliminate signal distortion caused by signal current aiding and opposing an AGC bias current supplied to the diodes by AGC driver 26 that comprises NPN transistor 56, the emitter of which is connected to a negative D.C. power supply terminal 57 through resistor 80; the collector of transistor 56 is connected through current limiting resistor 58 to the junction between the cathode of diode 53 and one electrode of shunt capacitor 55. If a single diode attenuator had been employed, rather than an attenuator including a pair of diodes with the D.C. and A.C. connections as stated, the AGC bias current supplied to the single diode would cause distortion of the IF signal. For IF signals approximately at the threshold of AGC level detector 25, the bias current supplied to diodes 52 and 53 from the collector of transistor 56 is very low, whereby the diodes have a high A.C. impedance and attenuation through resistor 51 is minimal. In contrast, for high level IF signals, diodes 52 and 53 are supplied with a relatively high bias current by the collector of transistor 56 to provide maximum signal attenuation.

The amplitude normalized envelope derived from the variable attenuator 23 is A.C. coupled through capacitor 61 to linear IF amplifier 24 comprising differential NPN transistors 62 and 63, having a common emitter connection, which is coupled to ground through resistor 64. The collector of transistor 62, the base of which is driven by the signal coupled through capacitor 61, is D.C. coupled to the base of PNP transistor 65 via resistor 60; the collector of transistor 65 is coupled back to the base of transistor 63 via a D.C. path including resistors 66 and 67 to provide bias stabilization for amplifier 24. The collector of transistor 63 and the emitter of transistor 65 are connected together and to a positive D.C. power supply terminal via resistors 68 and 69 to provide A.C. degeneration for a high level output of amplifier 24 so that the amplifier response remains linear over a relatively wide dynamic range of input amplitudes. The signal developed at the collector of transistor 65 is coupled to detector 28 of signal to noise ratio processing circuit 20.

AGC level detector 25 includes differential PNP transistor 71 and 72, having a common emitter connection to biasing resistor 73 that is connected to a positive D.C. power supply terminal. The signal at the collector of transistor 65 is A.C. coupled to the base of transistor 71 through capacitor 74, while the base of transistor 72 is maintained at a reference potential by a voltage divider including series resistors 75 and 76. Transistors 71 and 72 are biased so that with no A.C. output being derived from the collector of transistor 65, transistor 71 is biased to cutoff. Resistors 75 and 76 bias the base of transistor 72 at a negative potential equal to the peak output of the A.C. envelope derived from the collector of transistor 65. Thereby, transistor 71 conducts only in response to the peak input signal exceeding the preset AGC threshold established by resistors 75 and 76. These above threshold peaks are amplified by transistor 71 and are integrated or averaged by capacitor 77, connected to the collector of transistor 71, providing quasi-peak level defection.

The integrated above threshold peak voltages developed across capacitor 77 are coupled to the base of transistor 56 by resistor 78, which is connected between the collector of transistor 71 and the base of transistor 56. Transistor 56 responds to the integrated peak voltages, to amplify them. The peaks are filtered to a relatively constant D.C. level by capacitor 79 which shunts the collector of transistor 56 to ground, as well as by resistor 80, which is connected between the emitter of transistor 56 and a negative D.C. power supply. The specific component values indicated on FIG. 4 enable the circuit to perform in response to IF frequencies between 10 and 30 megahertz, and to provide an output that is maintained within 0.2db of a nominal 430 millivolts RMS value for an input signal range of 0dbm ±10db. It is to be understood that if the circuit is to be designed in connection with other frequency bands and other signal amplitude levels, the values of the components must be accordingly modified.

Figure 5:
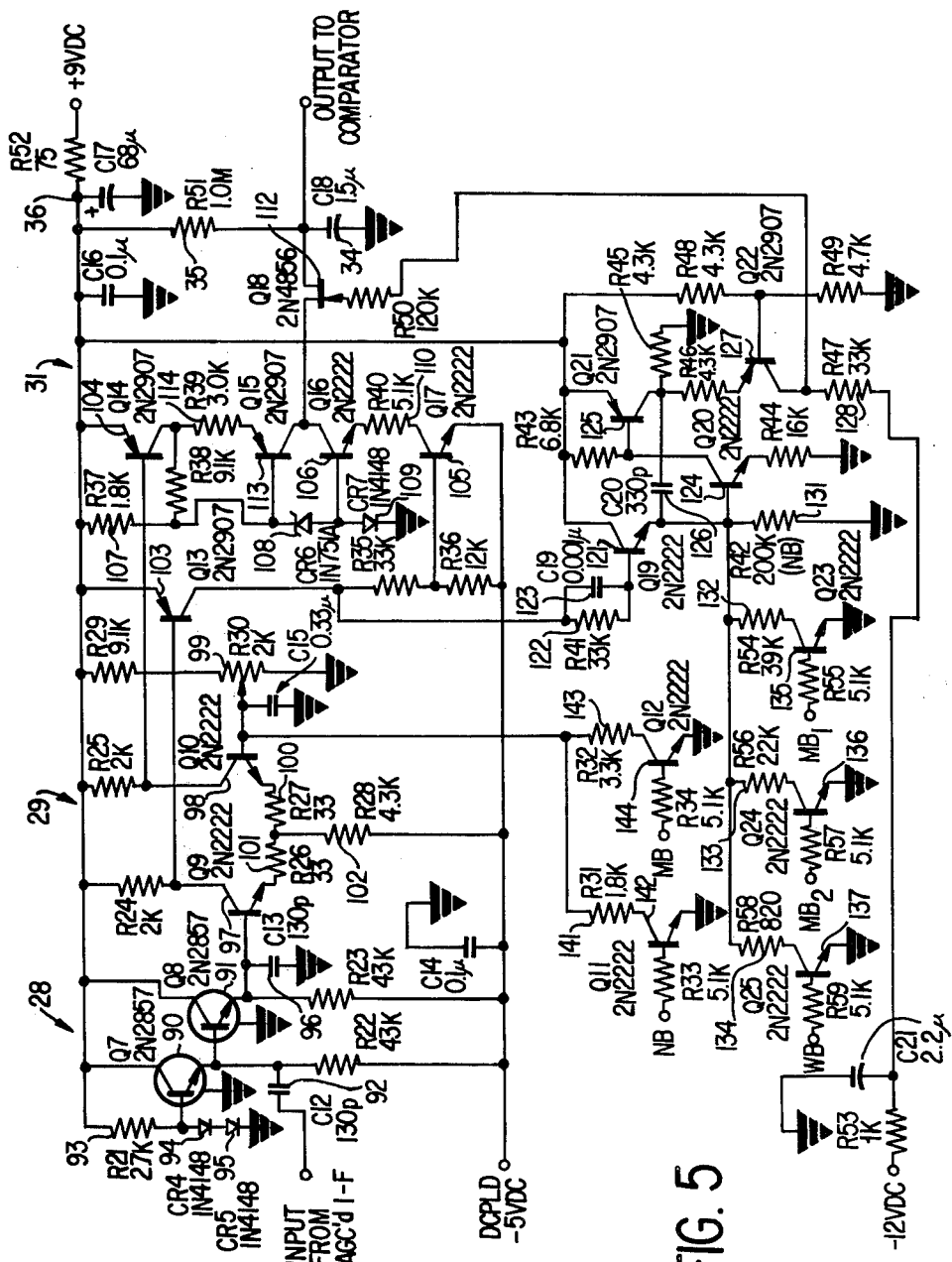
FIG. 5 is a circuit diagram of the signal to noise ratio processing circuitry included in the system of FIG. 1.

Reference is now made to FIG. 5 of the drawing wherein there is illustrated a detailed circuit diagram of the components included in signal to noise ratio processing circuit 20. Doubler detector 28 includes common collector, cascaded NPN transistors 90 and 91, having a common connection between the base of the latter and the emitter of the former that is responsive to the normalized IF output signal derived from the collector of transistor 65, FIG. 4, as A.C. coupled through capacitor 92. Base bias for transistor 90 is provided by voltage derived from a positive D.C. power supply terminal that is connected to the transistor base by a voltage divider including series resistor 93 and series diodes 94 and 95. Resistor 93 and diodes 94 and 95 provide offset and temperature compensation for doubler detector 28 so that with no A.C. input being applied to the doubler, the output of the doubler, at the emitter of transistor 91, is maintained substantially at zero volts even though the circuit is subjected to temperature variations. In response to the normalized, 430 millivolt RMS (1216 millivolt peak-to-peak) IF signal coupled by capacitor 92 to the base of transistor 91, a D.C. level of approximately 1.2 volts is developed at the emitter of transistor 91. The 1.2 volt D.C. potential is developed across capacitor 96 that is connected between the emitter of transistor 91 and ground.

The D.C. level derived at the output of detector 28 is coupled to threshold comparator 29 that includes a differential amplifier formed by NPN transistors 97 and 98. The base of transistor 97 is directly responsive to the voltage developed across capacitor 96, while the base of transistor 98 is responsive to a D.C. voltage developed at the slider of potentiometer 99 and is indicative of the signal to noise ratio threshold of comparator 29. The emitters of transistors 97 and 98 are connected to a common terminal by current limiting resistors 101 and 110, having a common terminal that is connected to a negative D.C. power supply terminal by resistor 102. In response to the D.C. level across capacitor 96 being above the D.C. level established by the slider of potentiometer 99, transistor 97 is activated into a conducting state to turn on PNP transistor 103 which is connected in the collector circuit of transistor 97. In contrast, in response to the D.C. level across capacitor 96 being less than the threshold input to the base of transistor 98, the latter transistor is activated into a conducting state and PNP transistor 104, connected to the collector of transistor 98, conducts. Conduction of transistors 103 and 104 is mutually exclusive, as is conduction of transistors 97 and 98.

Conduction of transistors 103 and 104 controls the direction of current supplied by constant current driver 31 to capacitor 34. In response to transistor 103 conducting, sufficient forward bias is applied to the base of transistor 105 by the collector current of transistor 103 to cause saturation of transistor 105. The emitter collector path of transistor 105 is connected in series with the emitter collector path of transistor 106, the base of which is biased by a voltage divider network including series connected resistor 107, Zener diode 108, and diode 109. The bias applied to the base emitter junction of transistor 106 in response to transistor 105 being saturated enables the emitter base path of transistor 106 to function as a constant, negative current supply source. Diode 109 clamps the base of transistor 106 one PN junction above ground so that emitter of transistor 106 is according at ground potential. With the emitter collector path of transistor 105 saturated, the negative D.C. supply voltage at the emitter of transistor 105 is thereby established across resistor 110; the negative D.C. supply voltage and resistor value are such that a one milliampere constant current flows from the emitter of transistor 106. A significant portion of the 1MA current flow from the emitter of transistor 106 is divided from the charge established across capacitor 34, through the collector-emitter path of transistor 106, since switch 33 (comprising field effect transistor 112) is always closed when transistor 105 is saturated. In response to capacitor 34 being fully discharged to ground potential, the 1MA current flow from the emitter of transistor 106 is derived from the positive power supply terminal and flows through resistor 107 and Zener diode 108 through the base emitter path of transistor 106, which is now also saturated, through resistor 110 and the saturated emitter collector path of transistor 105.

A positive constant current is supplied to capacitor 34 during the initial period, $T_1$, when transistor 98 is conducting by virtue of field effect transistor 112 being in a conducting state during this time period. To these ends, in response to transistor 98 being forward biased, transistor 104 is driven to saturation, and the collector of transistor 104 is driven to the decoupled positive D.C. potential (8.8 volts). The base of transistor 113, the base emitter path of which is connected in series with the emitter collector path of transistor 104 by resistor 114, is held at +5.2 volts D.C. by a 2MA bias current flowing through series diodes 108 and 109. Thereby, the emitter voltage of transistor 113 is +5.8 volts D.C. and the voltage drop across resistor 114 is 3.0 volts, resulting in a 1MA charging current flowing through the emitter collector path of transistor 104, resistor 114, the emitter collector path of transistor 113 and the source drain path of field effect transistor 112 into capacitor 34. Thereby, capacitor 34 is charged with the same current during the initial time interval of a noise hole as it is discharged in response to a signal level above the threshold of potentiometer 99. The maximum voltage to which capacitor 34 can be charged is limited to be +5.8 volt D.C. level established by clamping transistor 113 is saturation. A voltage of approximately +1 volt D.C. across capacitor 34 is used as a trigger level for activating output circuit 21.

Consideration is now given to the circuitry included in one-shot timer 32 which is activated into a binary one state as long as transistor 103 is conducting, and for an initial time thereafter. In response to transistor 103 being in a conducting state, current is supplied to the base of NPN transistor 121 through the parallel combination of resistor 122 and capacitor 123. Capacitor 123 provides speed-up for instantly switching transistor 121 to the conducting state in response to transistor 103 being rendered into the conducting state. In response to transistor 121 being rendered into the conducting state, NPN transistor 124, having its base connected directly to the emitter of transistor 121, is activated into a conducting, saturated state. A direct connection between the collector of transistor 124 and the base of PNP transistor 125 causes the latter transistor to be driven into saturation in response to transistor 124 being driven into saturation. A connection between the collector of transistor 125 and the base of transistor 124 via capacitor 126 provides turn-on regeneration in switching transistors 124 and 125 into the saturated state. The emitter collector path of transistor 127, connected in the common base mode, is connected in series with the collector of transistor 125. Thereby, transistor 127 converts zero to +9 volt D.C. voltage levels derived at the collector of transistor 125, which respectively occur when the transistor is not conducting and conducting, into −12 volt D.C. and +5.3 volt D.C. levels, which are derived at the collector of transistor 127 across load resistor 128 and a −12 volt D.C. power supply source. The voltage variations at the collector of transistor 127 are coupled to the gate electrode of field effect transistor 112 to control conduction of the field effect transistor. In response to transistor 125 being saturated, the voltage at the collector of transistor 127 is maintained at a positive D.C. level to provide a virtually zero impedance between the source and drain electrodes of field effect transistor 112. In contrast, the source drain impedance of field effect transistor 112 is virtually an open circuit in response to transistor 125 being in a cutoff condition and a negative voltage being derived at the collector of transistor 127.

During the initial period, $T_1$, after transistor 97 has been cut off in response to the input to the base of transistor 97 being less than the voltage on the slider of potentiometer 99, transistors 103 and 121 are also activated into the cutoff condition. However, transistors 124, 125 and 127 remain in the conducting state during $T_1$ because of the time required to discharge capacitor 126 through the base circuit of transistor 124. The discharge time of capacitor 126 is determind primarily by the value of capacitor 126 and the resistance shunting the emitter base path of transistor 124. After the voltage on capacitor 126 has discharged to a low enough level, transistors 124 and 125 regeneratively cut off, causing the collector voltage of transistor 127 to decrease to a level whereby field effect transistor 112 is also cut off.

In response to transistor 112 being cut off, capacitor 34 is charged by a trickle current flowing through resistor 35 from the D.C. power supply at terminal 36, as described supra. In the alternative, resistor 35 could be eliminated and the trickle current supplied by the base current of transistor 151, FIG. 6.

The resistance shunting the emitter base path of transistor 124 comprises a fixed resistor 131, as well as three fixed resistors 132–134 which are selectively connected in shunt with resistor 131, depending upon the selected receiver IF bandwidth. Resistors 132–134 are selectively connected in circuit with resistor 131 for forward biasing the base emitter junction of one of transistors 135–137; the emitter collector path of each of transistors 135–137 is respectively connected in series with each of resistors 132–134. For a narrow band IF bandwidth, only resistor 131 is connected in circuit so that the hold time of one-shot timer 32 is 100 microseconds; in response to resistors 132, 133 and 134 selectively being connected in circuit with resistor 131 (for first and second mid band and a wide band IF), the one-shot hold times are respectively decreased to 30 microseconds, 21 microseconds and 8 microseconds. These one-shot times accommodate IF bandwidths from 10 KHz to 2.2 MHz, thereby enabling modulation signals from 300 Hz linear AM to pulsed AM signals having pulse widths as narrow as 20 microseconds to be accommodated.

It has also been found desirable to change the signal to noise ratio threshold applied to the base of transistor 98 as a function of the bandwidth of the IF signal. For the narrowest bandwidth IF signal of 10 KNz, resistor 141 is connected in shunt with the slider of potentiometer 99 by forward biasing the base emitter path of transistor 142, the collector of which is connected directly to resistor 141. For the two medium bandwidth situations which occur when transistors 135 and 136 are forward biased, resistor 143 is connected in shunt with the slider of potentiometer 99 by forward biasing the emitter base junction of transistor 144, having its emitter collector path connected in series with resistor 143. Thereby, the signal to noise ratio threshold of threshold comparator 29 is decreased for narrower band signals to compensate for the characteristics of wide band versus narrow band noise, and maintain a constant signal to noise ratio threshold.

Figure 6:
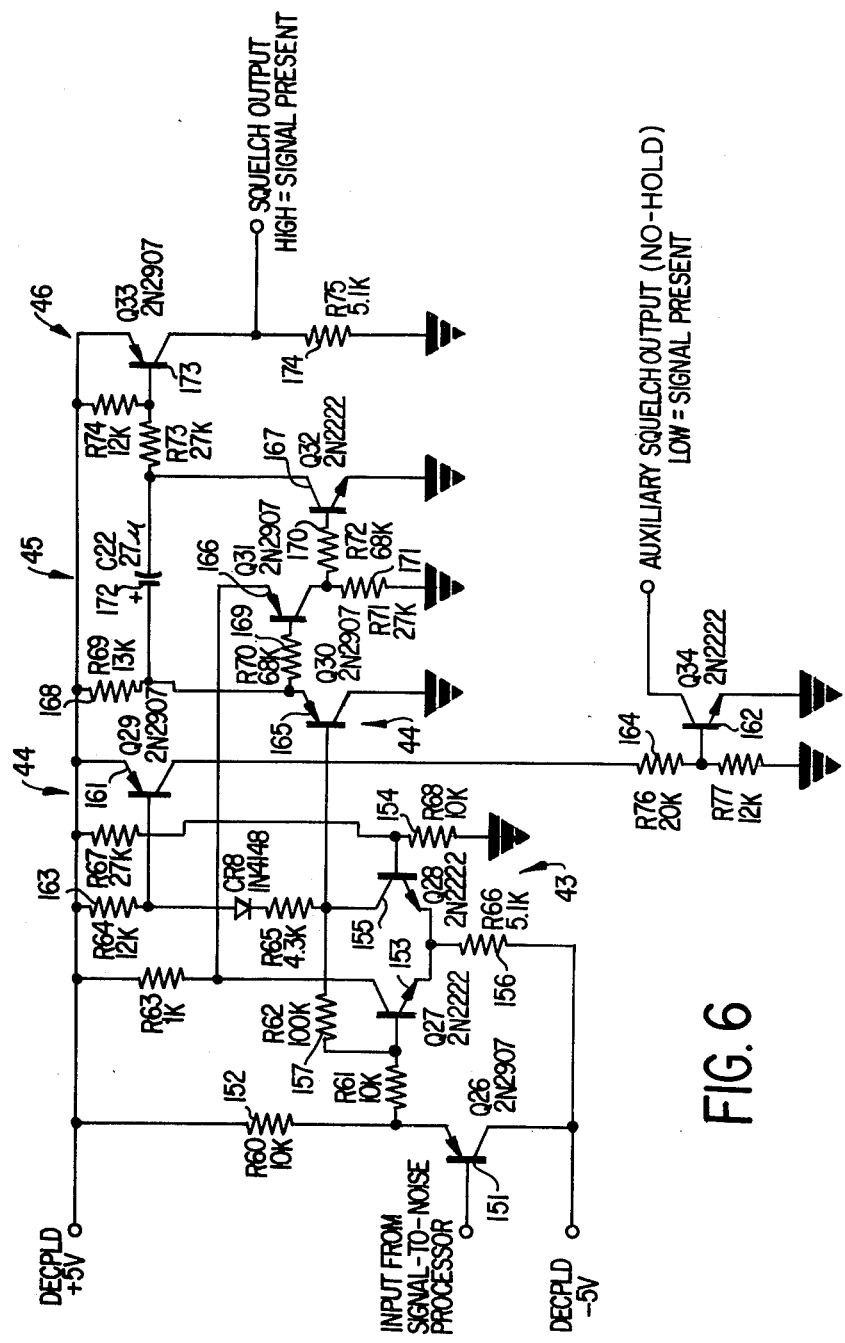
FIG. 6 is a circuit diagram of the circuitry included in the ouput time constant and switching circuitry of the block diagram of FIG. 1.

Reference is now made to FIG. 6 of the drawing wherein there is illustrated a schematic, detailed circuit diagram of the components included in output time constant and switching circuit 21. The voltage developed across capacitor 34 is coupled to output comparatpr 43 and Schmitt trigger 4 by buffer PNP transistor 151 which modifies the D.C. level of the voltage across the capacitor. To this end, the capacitor voltage is coupled to the base of transistor 151, having an emitter resistor 152 across which a load voltage is developed and coupled to the base of NPN transistor 153, included in output comparator 43 and Schmitt trigger 44, formed as a single circuit. A second reference input to comparator 43 is derived across resistor 154 and coupled to the base of NPN transistor 155. The reference voltage is +1.4 VDC to compensate for the offset introduced by buffer transistor 151. The emitters of transistors 153 and 155 are connected together and through a common load resistor 156 to a negative D.C. power supply terminal.

The collector of transistor 155 is regeneratively coupled to the base of transistor 153 by resistor 157 which provides the hysteresis (Schmitt trigger) effect that prevents chatter for signal to noise ratios in the vicinity of a +1 volt D.C. threshold value for the voltage across capacitor 34. In response to the voltage across capacitor 34, offset by transistor 151, being in excess of the 1.4 volt reference level applied by resistor 154 to the base of transistor 155, to indicate a low signal to noise ration, transistor 153 is in a conducting state, while transistor 155 is cut off. For an increasing signal to noise ratio, wherein the voltage across capacitor 34 beings to drop below the +1 D.C. level, transistor 153 is activated into a cutoff condition, while transistor 155 is activated into a conducting, unsaturated condition. In response to current flowing into the collector of transistor 155, regenerative feedback occurs between the collector of transistor 155 and the base of transistor 153. The current flow through resistor 157 modifies the base emitter bias voltage of transistor 153 when the transistor is cut off compared to when it is conducting. Thereby, transistor 153 returns from the non-conducting (signal) state to the conducting (noise) state for a greater voltage across capacitor C34 (poorer signal-to-noise ratio) than was required to initially activate transistor 153 to the non-conducting state. Hence, resistor 157 provides the hysteresis that prevents chattering in response to small amplitude variations in the voltage of capacitor 34 around the threshold level set by the bias applied by resistor 154 to the base of transistor 155.

To provide an indication of the signal to noise ratio sensed by output comparator 43 at any time, a voltage sensing circuit comprising PNP transistor 161 and NPN transistor 162 is provided. The base of transistor 161 is connected to be responsive to the collector voltage of transistor 155, since the emitter base junction thereof is connected across resistor 163 in the collector load circuit of transistor 155. The base of transistor 162 is D.C. coupled by resistor 164 to the collector of transistor 161; the emitter of transistor 162 is grounded so that the impedance between the emitter and the collector of transistor 162 serves as a binary indication of whether the signal to noise ratio voltage derived across capacitor 34 is instantaneously above or below threshold, including the hystersis effect. In response to transistor 155 conducting, transistors 161 and 162 are both activated into a saturated condition; both of transistors 161 and 162 are cut off in response to transistor 155 being cut off. Thereby, the emitter collector impedance of transistor 162 provides an indication of the signal to noise ratio of the received signal.

To control the operation of gate 15, one-shot hold network 45 includes PNP transistors 165 and 166, as well as NPN transistor 167. The base of transistor 165 is directly connected to the collector of transistor 155, while the collector and emitter of transistor 165 are respectively connected to ground and a +5 volt D.C. power supply terminal, with the latter connection being through resistor 168. The emitter of transistor 165 is D.C. coupled to the base of transistor 166 by resistor 169; the emitter and collector of transistor 166 are respectively connected to the collector of transistor 153 and ground, with the latter connection being through load resistor 171. The voltage developed across collector load resistor 171 is D.C. coupled to the base of transistor 167 by resistor 170.

To provide for the regenerative, capacitive feedback of one-shot hold network 45, the collector of transistor 167 is coupled back to the emitter of transistor 165 through capacitor 172. In response to transistor 155 being cut off, each of transistors 165–167 is also cut off and a relatively high D.C. voltage is developed at the collector of transistor 167. In response to transistor 155 being activated into a conducting state, each of transistors 165–167 is activated into a saturated state and the voltage at the collector of transistor 167 drops virtually to ground. Transistors 165–167 are transferred from a cutoff to a conducting state without delay because of the regenerative speed-up effect of capacitor 172 between the collector of transistor 167 and the emitter of transistor 165.

However, in response to the signal to noise ratio decreasing, whereby the voltage across capacitor 34 increases and transistor 153 is activated into a conducting state, there is a delay in the transfer of transistor 167 into a cutoff condition because of the tendency of capacitor 172 to maintain the emitter of transistor 165 at a relatively low voltage. Capacitor 172 charges slowly through resistor 168 toward the voltage of the D.C. power supply terminal until the voltage at the emitter of transistor 165 is approximately 0.6 volts D.C. below the voltage on the emitter of transistor 166, which is maintained at approximately +3.8 volts D.C. while transistor 153 is in a conducting state. In response to transistor 166 being biased to cutoff in response to the rising voltage applied to its base, approximately 0.4 seconds later than the change in state of transistors 155, 161 and 162, the voltage at the collector of transistor 167 rises. The increased voltage at the collector of transistor 167 is regeneratively coupled through capacitor 172 to the base of transistor 166 to provide a step increase in the voltage at the collector of transistor 167.

The step voltage changes at the collector of transistor 167 are coupled to gate 15 by a driver 46 that include PNP transistor 173, connected in a common emitter mode. The collector of transistor 173 is connected to ground by load resistor 174, across which are derived positive and zero voltage states that are coupled to gate 15 to control opening and closing of the gate.

The present invention, utilizing the circuitry specifically illustrated in FIGS. 4–6, has been thoroughly tested in VHF receivers for CW, linear and pulse AM, and FM modulation. The bandwidths of the IF signals driving the circuitry have ranged from 10 KHz to 2.2 MHz, and the center frequencies of the IF signals have been at 10.7 MHz and 30.7 MHz. Typical test data are presented below:

|     | IF BANDWIDTH | IF FREQUENCY |
| --- | --- | --- |
| NB | 10 KHz | 10.7 MHz → A |
|    | 25 KHz | 10.7 MHz → B |
| MB₁ | 60 KHz | 10.7 MHz → C |
| MB₂ | 180 KHz | 10.7 MHz → D |
| WB | 0.60 MHz | 30.7 MHz → E |
|    | 1.1 MHz | 30.7 MHz → F |
|    | 2.2 MHz | 30.7 MHz → G |

|   | CW Threshold $\frac{S+N}{N}$ (db) |
| --- | --- |
| A | 6.5 |
| B | 6.0 |
| C | 5.5 |
| D | 6.0 |
| E | 6.5 |
| F | 6.0 |
| G | 5.5 |

| AM Modulation |   | AM Threshold $\frac{S+N}{N}$ (db) |
| --- | --- | --- |
| A | 90% linear | 4.0 |
| B | 90% linear | 4.0 |
| C | 150μs pulse | 6.0 |
| D | 60μs pulse | 5.0 |
| E | 20μs pulse | 3.0 |
| F | 20μs pulse | 4.0 |
| G | 20μs pulse | 4.0 |

| FM Modulation |   | FM Threshold $\frac{S+N}{N}$ (db) |
| --- | --- | --- |
| B | ±8 KHzΔf at 4KHz | 5.5 |
| C | ±22 KHzΔf at 7.5KHz | 5.5 |
| D | ±75 KHzΔf at 22.5KHz | 5.5 |
| E | ±225 KHzΔf at 75KHz | 7.0 |
| F | ±360 KHzΔf at 120KHz | 7.5 |
| G | ±360 KHzΔf at 120KHz | 4.0 |

While there has been described and illustrated one specific embodiment of the invention, it will be clear that variations in the details of the embodiment specifically illustrated and described may be made without departing from the true spirit and scope of the invention as defined in the appended claims.

1. Apparatus for deriving a signal indicative of the signal to noise ratio of a carrier susceptible to being modulated by any of AM voice, AM pulse, CW, interrupted CW or angle modulated signals comprising means for deriving a waveform that is a replica of the amplitude variations of the envelope of the modulated carrier, a capacitor, and means responsive to the waveform for applying: (a) a constant current of one polarity to the capacitor while the waveform amplitude is above a threshold level indicative of a noise threshold, (b) a constant current of an other polarity to the capacitor for an initial predetermined time while the waveform is below the threshold level, and (c) a much smaller current of the other polarity to the capacitor during the time while the waveform is below the threshold level after the initial time, whereby the capacitor voltage level is indicative of the signal to noise ratio.

2. The apparatus of claim 1 wherein the means for applying further including means for varying the initial predetermined time.

3. The apparatus of claim 1 wherein the means for applying comprises: a switch in series with the capacitor, first and second constant current sources for respectively deriving the constant currents of one polarity and the other polarity, and means for activating the switch to connect the capacitor with said first and second current sources in response to the waveform amplitude being above the threshold level and during the initial time for the waveform amplitude being below the threshold level.

4. The apparatus of claim 3 wherein the switch activating means comprises an amplitude comparator responsive to the waveform and an amplitude level indicative of the threshold level, said amplitude comparator including means for deriving a first binary level while the waveform is above the threshold level and during the initial time thereafter and for deriving a second binary level while the waveform is below the threshold level after the initial time has elapsed, said comparator being connected to said switch so that said first and second levels respectively cause the closing and opening of the switch.

5. The apparatus of claim 4 further including means for varying the threshold level as a function of the IF bandwidth.

6. The apparatus of claim 5 further including means for varying the initial time as a function of the IF bandwidth.

7. The apparatus of claim 4 further including means for varying the initial time as a function of the IF bandwidth.

8. A radio receiver squelch control circuit responsive to a carrier susceptible to being modulated by any of AM voice, AM pulse, CW, interrupted CW or angle modulated signals comprising means responsive to the modulated carrier for deriving an amplitude normalized carrier, means responsive to the amplitude normalized carrier for deriving a D.C. voltage having an amplitude indicative of the signal to noise level of the normalized carrier, said last named means comprising: means for deriving a waveform that is a replica of the amplitude variations of the envelope of the modulated carrier, a capacitor, and means responsive to the waveform for applying: (a) a constant current of one polarity to the capacitor while the waveform amplitude is above a threshold level indicative of a noise threshold, (b) a constant current of an other polarity to the capacitor for an initial predetermined time while the wave form is below the threshold level, and (c) a much smaller current of the another polarity to the capacitor during the time while the waveform is below the threshold level after the intial time, whereby the capacitor voltage level is indicative of the signal to noise ratio; and means for deriving a squelch control signal in response to a comparison of the capacitor voltage and a reference level.

9. The circuit of claim 8 wherein the squelch control signal deriving means includes mean for providing amplitude hysteresis in the comparison of the capacitor voltage and the reference level.

10. The circuit of claim 8 wherein the squelch control signal deriving means includes means for preventing a change in state of the squelch control signal in response to relatively short term fading of the carrier.

11. The circuit of claim 10 wherein the means for preventing change includes a one-shot trigger having a hold circuit.

12. The circuit of claim 10 wherein the squelch control signal deriving means includes means for providing amplitude hystersis in the comparison of the capacitor voltage and the reference level.

13. A radio receiver responsive to an RF carrier susceptible to being modulated by any of AM voice, AM pulse, CW, interrupted CW or angle modulation, comprising an IF amplifier for deriving an IF signal having envelope amplitude variations corresponding with envelope amplitude variations of the RF carrier within a predetermined bandwidth, means responsive to the modulated IF carrier for deriving an amplitude normalized IF carrier, means responsive to the amplitude normalized IF carrier for deriving a D.C. voltage having an amplitude indicative of the signal to noise level of the normalized IF carrier, said last named means comprising: means for deriving a waveform that is a replica of the amplitude variations of the envelope of the modulated IF carrier, a capacitor, and means responsive to the waveform for applying: (a) a constant current of one polarity to the capacitor while the waveform amplitude is above a threshold level indicative of a noise threshold, (b) a constant current of an other polarity to the capacitor for an initial predetermined time while the waveform is below the threshold level, and (c) a much smaller current of the another polarity of the capacitor during the time while the waveform is below the threshold level after the initial time, whereby the capacitor voltage level is indicative of the signal to noise ratio; means for deriving a squelch control signal in response to a comparison of the capacitor voltage and a reference level, a detector responsive to the IF signal for deriving an audio signal that is a replica of the modulation applied to the carrier, an output device, and a gate responsive to the squelch control signal for controlling coupling of the audio signal between the detector and output device.

14. Apparatus for indicating the signal to noise ratio of a waveform having a predetermined bandwidth and therefore longest noise undulations of predetermined duration comprising means responsive to the waveform for indicating the relative lengths of time the waveform is: (a) above a threshold value, (b) below a threshold value for a length of time substantially equal to or less than the time of the longest noise undulation on the waveform, and (c) below a threshold value for a length of time greater than the length of time of the longest noise undulation on the waveform, and means responsive to the indicating means for differentially accumulating the net lengths of time indicated by (a) and (b) with substantially equal contributions and for accumulating the length of time indicated by (c) with a much lower contribution than the equal contributions, the much lower contribution being made in the direction of the contribution resulting from (b).

15. A method of indicating the signal to noise ratio of a waveform having a predetermined bandwidth and therefore longest noise undulations of predetermined duratuons comprising indicating the relative lenghts of time the waveform is: (a) above a threshold value, (b) below a threshold value for a length of time substantially equal to or less than the time of the longest noise undulation on the waveform, and (c) below a threshold value for a length of time greater than the length of time of the longest noise undulation on the waveform, differentially accumulating the net lengths of time indicated by (a) and (b) with substantially equal contributions, and accumulating the length of time indicated by (c) with a much lower contribution than the equal contributions, the much lower contribution being made in the direction of the contribution resulting from (b).

* * * * *